(12) United States Patent
Hirose et al.

(10) Patent No.: US 9,319,002 B2
(45) Date of Patent: *Apr. 19, 2016

(54) DISTORTION COMPENSATION CIRCUIT AND TRANSMISSION DEVICE USING DISTORTION COMPENSATION CIRCUIT AND HIGH-FREQUENCY POWER AMPLIFIER

(71) Applicant: HITACHI KOKUSAI ELECTRIC INC., Tokyo (JP)

(72) Inventors: Nobuo Hirose, Kodaira (JP); Kazuhiko Nakamura, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/428,518

(22) PCT Filed: Jun. 4, 2013

(86) PCT No.: PCT/JP2013/065475
§ 371 (c)(1),
(2) Date: Mar. 16, 2015

(87) PCT Pub. No.: WO2014/050218
PCT Pub. Date: Apr. 3, 2014

(65) Prior Publication Data
US 2015/0236655 A1   Aug. 20, 2015

(30) Foreign Application Priority Data

Sep. 25, 2012 (JP) ................................ 2012-210755

(51) Int. Cl.
*H04L 25/03* (2006.01)
*H03F 1/32* (2006.01)
*H03F 3/21* (2006.01)
*H03F 3/19* (2006.01)

(52) U.S. Cl.
CPC ................ *H03F 1/3241* (2013.01); *H03F 3/19* (2013.01); *H03F 3/21* (2013.01); *H03F 2200/171* (2013.01); *H03F 2201/3209* (2013.01); *H03F 2201/3227* (2013.01)

(58) Field of Classification Search
CPC ....... H03C 1/06; H03F 1/3247; H03F 1/3258; H04B 2001/0425; H04L 27/368
USPC ................................................ 375/295, 297
See application file for complete search history.

(56) References Cited

U.S. PATENT DOCUMENTS

| | | | |
|---|---|---|---|
| 6,577,192 B2 | 6/2003 | Maniwa et al. | |
| 7,242,247 B2 | 7/2007 | Hirose et al. | |
| 8,938,027 B2 * | 1/2015 | Hirose et al. | 375/297 |
| 2002/0079965 A1 | 6/2002 | Maniwa et al. | |
| 2004/0232986 A1 | 11/2004 | Hirose et al. | |
| 2005/0068102 A1 | 3/2005 | Hongo et al. | |
| 2005/0184803 A1 | 8/2005 | Hirose et al. | |
| 2009/0174473 A1 * | 7/2009 | Woo et al. | 330/10 |
| 2010/0295612 A1 * | 11/2010 | Ohkawara et al. | 330/149 |
| 2011/0032033 A1 | 2/2011 | Keerthi et al. | |
| 2011/0050337 A1 | 3/2011 | Ito et al. | |
| 2011/0163806 A1 * | 7/2011 | Hongo | 330/149 |
| 2011/0175678 A1 * | 7/2011 | Velazquez | 330/149 |

FOREIGN PATENT DOCUMENTS

| | | |
|---|---|---|
| JP | H09-82158 A | 3/1997 |
| JP | 2005-101908 A | 4/2005 |
| JP | 2005-244430 A | 9/2005 |
| JP | 2008-294518 A | 12/2008 |
| JP | 2009-219167 A | 9/2009 |
| JP | 2011-049754 A | 3/2011 |
| WO | WO-00/74232 A1 | 12/2000 |
| WO | WO-2004/045067 A1 | 5/2004 |

OTHER PUBLICATIONS

Hongo et al., "Digital Pre-Distorter for Power Amplifier Having Memory Effect", Electronic Information Communication Society Paper, vol. J88-B, No. 10, pp. 2062-2071 (Oct. 1, 2005).
Nikkei Electronics, Aug. 22, 2011 p. 67-0.76 (p. 74).
Toshiba, Technical Report on Image Information Media Society, ITE Technical Report vol. 36, No. 10RCT2012-47 (Feb. 2012).

International Search Report for PCT/JP2013/065475, ISA/JP, mailed Aug. 27, 2013.
Analog Devices, Orthogonal Compensation ADS, AD9269, Jan. 2010.
Analog Devices, 500 MSPS ADC, AD9434, Mar. 2011.
Texas Instruments, 800 MSPS Orthogonal Compensation DAC, DAC5688, Dec. 2007—Revised Aug. 2010.
Freescale, 470-860MHz, DVB-T (8k OFDM 8MHz), 125W MOSFET, MRFEVP8600H, Sep. 2011.

* cited by examiner

*Primary Examiner* — Kevin M Burd
(74) *Attorney, Agent, or Firm* — Harness, Dickey & Pierce, PLC

(57) ABSTRACT

The purpose of the invention is to reduce Cartesian loop transmission delay for compensating the distortion occurring in a high-frequency power amplifier and make the distortion compensation converge quickly, thereby increasing the efficiency. A transmission device has: a high-frequency power amplifier; a pre-distortion compensation circuit for independently generating the coefficients of the distortion compensation signal for each order of the odd and even symmetric distortions of the high-frequency power amplifier; a means for varying the power supply voltage of the high-frequency power amplifier with an orthogonal modulation OFDM input signal; a digital frequency converter; a high-frequency band ADC; and a high-frequency band DAC. In the transmission device, an error distortion compensation signal is created from the output of the high-frequency power amplifier and the orthogonal modulation OFDM input signal, and a delay device is inserted at the previous stage of a distortion compensation circuit, said delay device having a delay equivalent to a time constant for varying the power supply voltage of the high-frequency power amplifier with the orthogonal modulation OFDM input signal.

4 Claims, 7 Drawing Sheets

DISTORTION COMPENSATION CIRCUIT AND TRANSMISSION DEVICE USING DISTORTION COMPENSATION CIRCUIT AND HIGH-FREQUENCY POWER AMPLIFIER

CROSS-REFERENCE TO RELATED APPLICATIONS

This application is a 371 U.S. National Stage of International Application No. PCT/JP2013/065475, filed on Jun. 4, 2013, which claims the benefit of priority from Japanese Patent Application No. 2012-210755, filed on Sep. 25, 2012. The disclosures of the above applications are incorporated herein by reference.

TECHNICAL FIELD

The present invention relates to distortion compensation to reduce a distortion component produced by a transmission device which transmits radio waves which are power-amplified by a high-frequency power amplifier.

BACKGROUND ART

The orthogonal frequency division multiplexing (OFDM) modulation method (hereinafter referred to as OFDM method) and the quardrature amplitude modulation method (hereinafter referred to as QAM method) are adopted in the terrestrial digital broadcasting and the multimedia broadcasting. The modulation signal in the terrestrial digital broadcasting and the multimedia broadcasting is constructed by constituent unit periods and has average power and peak power of a signal which are considerably different.

When the linearity is ensured by supplying a power amplifier with such a fixed voltage as to be able to produce peak power in a power amplification system, the time that the peak power is produced is extremely short and as a result the power supply efficiency of the amplifier is reduced. As a technique for solving this problem, there is known an envelope tracking method power amplification system (EER) as described in a patent literature 4. When a power supply voltage of an amplifier is changed, the characteristics of the amplifier are also changed. When a class AB push-pull amplifier is adopted in order to improve the efficiency, the characteristics of the amplifier are also varied at small amplification and peak.

By the way, an MOS-FET makes conduction only by applying a voltage between a source and a gate thereof and accordingly a transient response thereof in the direction of turning-on is fast, although since the MOS-FET continues to be conductive until electrical charges are removed from the gate thereof, a transient response in the direction of turning-off is slow. Hence, asymmetrical distortion is made large in an up-and-down direction of waveform on a time axis and even in an up-and-down direction on a frequency axis. Moreover, the MOS-FET has a conductive resistance varied in temperature. Further, in an MOS-FET made of GaN, electrons are trapped in a gate electrode in proportion to an accumulation amount of an electric field on a gate by a voltage on a drain electrode, so that a conductive resistance thereof is deteriorated (refer to a non-patent literature 7). These variation and deterioration are named historical distortion or memory distortion generically.

As a conventional technique of pre-compensation of non-linear distortion, specifically as an example of a technique of independent compensation of odd order distortion, the patent literature 1 may be referred to.

A high-frequency power amplifier has so-called remarkable memory effect in which a past signal is generally influenced with extension to a wide band of signal and distortion is increased, so that hysteretic characteristic and even symmetrical distortion are increased. Thus, a circuit scale for the pre-compensation of distortion is enlarged. Accordingly, a method of reducing the circuit scale of the pre-compensation of distortion by the memory effect of the high-frequency power amplifier is proposed in a non-patent literature 1.

A patent literature 2 discloses a pre-compensation technique of distortion using time difference of the even order.

A patent literature 3 discloses a pre-compensation technique of distortion using differentiation of amplitude and phase.

However, the techniques for compensating the even order distortion by the differentiation of amplitude and phase in the patent literatures 2 and 3 have a drawback that convergence of the pre-compensation for reducing the even order distortion of the memory effect requires time even if the even order distortion of the memory effect is changed.

Furthermore, a Cartesian loop transmitter feeds back an output signal of an amplifier to a baseband part and compares signals before and behind amplification with each other to make detection and correction of error, so that the linearity of the transmitter can be increased. However, input/output and wiring of a chip are contained in a path for the feedback and accordingly transmission of signals is delayed for that. Influence of this delay is increased in proportion to frequency and accordingly there arises a problem that the stability is deteriorated when the band is widened. Accordingly, this time, a route which does not pass through a frequency converter is added in addition to the feedback path in the prior art and only a high-frequency component which influences the stability passes through the route to thereby reduce the influence of delay (refer to non-patent literature 6). In the non-patent literature 6, a complicated analog feedback path is added, so that it is difficult to make application to large-power amplification.

Accordingly, in the wide-band OFDM, it is difficult to improve the efficiency by combining the EER as described in patent literature 4 in which a power supply voltage of an amplifier is varied to change even characteristics of the amplifier with the pre-compensation technique of distortion as described in patent literatures 1 to 5 in which the convergence requires time.

Hence, as described in the patent literature 5, RF input and RF feedback are subjected to FFT and distortion coefficients of AM/PM conversion distortion, spectral re-growth distortion and memory effect distortion are calculated. The technique that RF input power and distortion coefficients are used to compensate I/Q input subjected to orthogonal demodulation of RF linearly and orthogonally modulate the input to be amplified is put to practical use in the terrestrial digital broadcasting.

Further, in non-patent literature 8, a terrestrial digital broadcasting transmitter manufactured as a product is described in which IM=−30 dB is realized in Doherty amplification of a carrier amplifier, a peak amplifier and a combined circuit, IM=−41 dB is realized in the distortion compensation and a complicated nonlinear filter is used to add historical (memory) distortion compensation and realize such low distortion and high efficiency as IM=−53 dB and power efficiency 27%.

CITATION LIST

Patent Literature

Patent Literature 1: WO2004/045067
Patent Literature 2: JP-A-2005-101908

Patent Literature 3: JP-A-2008-294518
Patent Literature 4: JP-A-2011-049754
Patent Literature 5: US 2011/0032033

Non-Patent Literature

Non-Patent Literature 1: Naoki Hongo, Tetuhiko Miyatani, Youichi Okubo and Yosihiko Akaiwa, "Digital Pre-Distorter for Power Amplifier having Memory Effect", Electronic Information Communication Society Paper, Vol. J88-B, No. 10, pp. 2062-2071, 2005/10/01
Non-Patent Literature 2: Analog Devices, Orthogonal Compensation ADC, AD9269
Non-Patent Literature 3: Analog Devices, 500 Msps ADC, AD9434 Non-Patent Literature 4: Texas Instruments, 800 Msps Orthogonal Compensation DAC, DAC5688
Non-Patent Literature 5: Free Scale, 470-860 MHz, DVB-T (8 k OFDM 8 MHz), 125 W MOS-FET, MRFEVP8600H
Non-Patent Literature 6: Toshiba, Presentation of Report, http://www.toshiba.co.jp/rdc/rd/detail j/1002 02.htm
Non-Patent Literature 7: Nikkei Electronics, 2011 08.22, p. 67-p. 76 (p. 74)
Non-Patent Literature 8: Toshiba, Technical Report on Image Information Media Society, ITE Technical Report Vol. 36, No. 10RCT2012-47 (February 2012)

SUMMARY OF INVENTION

Technical Problem

According to the present invention, in the technique of the patent literatures 2 and 3 in which the even order distortion of the memory effect produced by the high-frequency power amplifier is compensated by means of differentiation of amplitude and phase, the long Cartesian loop transmission delay that is the total of the delay by orthogonal modulation of baseband, D/A, frequency conversion and filter and the delay by frequency conversion, filter, A/D and orthogonal demodulation in feedback exists in the signal transmission in which the output signal of the amplifier is fed back to the baseband part by the Cartesian loop and signals before and behind amplification are compared with each other to make detection and correction of error and accordingly it takes time to make convergence of the pre-compensation of distortion for reducing the even order distortion of the memory effect since the Cartesian loop transmission delay is longer than the time constant of the memory effect due to the OFDM characteristics having low average power and large peak power even if the even order distortion of the memory effect is changed.

Furthermore, since the Cartesian loop transmission delay is longer than the time constant for varying the power supply voltage of the high-frequency power amplifier with the orthogonal modulation OFDM input signal, it requires time to converge the pre-compensation of distortion.

Moreover, since the Cartesian loop transmission delay is longer than class AB peak variation time constant, it takes time to converge the pre-compensation of distortion.

Accordingly, the Doherty amplification of the carrier amplifier, the peak amplifier and the combined circuit is eliminated and a power supply voltage is made to follow an envelope using push-pull amplification, so that high efficiency is realized as compared with the Doherty amplification. Concretely, it is an object to make shortening of the Cartesian loop transmission delay, convergence in a short time and improvement of efficiency by making the pre-compensation distortion follow the envelope so that the power supply voltage follows the envelope in the push-pull amplification.

Solution to Problem

According to the present invention, in order to achieve the above object, a distortion compensation circuit which compensates distortion of a high-frequency power amplifier which power-amplifies an OFDM input signal having a frequency converted in a high-frequency band or an OFDM input signal in a high-frequency band, comprises an odd symmetrical distortion compensation signal generation circuit to independently generate an odd symmetrical distortion compensation coefficient signal of each order of the high-frequency power amplifier from a high-frequency signal or a high-frequency IF signal or a high-frequency OFDM input signal which is an input signal in a high-frequency band (hereinafter referred to as a high-frequency OFDM input signal) obtained by subjecting an OFDM signal to orthogonal modulation and digital-up conversion, an odd symmetrical distortion compensation signal addition circuit to prepare an error odd symmetrical distortion compensation signal from error of the high-frequency OFDM input signal, an output of the high-frequency power amplifier and an odd symmetrical distortion compensation coring signal obtained by coring the generated odd symmetrical distortion compensation coefficient signal of each order and add an odd symmetrical distortion compensation signal obtained by adding the error odd symmetrical distortion compensation signal and the odd symmetrical distortion compensation coefficient signal to the high-frequency OFDM input signal, an even symmetrical distortion compensation signal generation circuit to independently generate an even symmetrical distortion compensation coefficient signal of each order of the high-frequency power amplifier from the high-frequency OFDM input signal, and an even symmetrical distortion compensation signal addition circuit to prepare an error even symmetrical distortion compensation signal (following envelope) from error of the high-frequency OFDM input signal, the output of the high-frequency power amplifier and an even symmetrical distortion compensation coring signal obtained by coring the generated even symmetrical distortion compensation coefficient signal of each order and add an even symmetrical distortion compensation signal obtained by adding the error even symmetrical distortion compensation signal and the even symmetrical distortion compensation coefficient signal to the high-frequency OFDM input signal, whereby odd symmetrical distortion and even symmetrical distortion are compensated independently.

Furthermore, a distortion compensation circuit which compensates distortion of a high-frequency power amplifier which power-amplifies an OFDM input signal having a frequency converted in a high-frequency band, comprises an odd symmetrical distortion compensation signal generation circuit to independently generate odd symmetrical distortion compensation coefficient signal of each order of the high-frequency power amplifier from an OFDM input signal (hereinafter referred to as an orthogonal modulation OFDM input signal) obtained by subjecting an OFDM signal to orthogonal modulation, an odd symmetrical distortion compensation signal addition circuit to prepare an error odd symmetrical distortion compensation signal from error of the orthogonal modulation OFDM input signal, an output of the high-frequency power amplifier and an odd symmetrical distortion compensation coring signal obtained by coring the generated odd symmetrical distortion compensation coefficient signal of each order and add an odd symmetrical distortion compensation signal obtained by adding the error odd symmetrical distortion compensation signal and the odd symmetrical distortion compensation coefficient signal to the orthogonal modulation OFDM input signal, an even symmetrical distortion compensation signal generation circuit to independently generate an even symmetrical distortion compensation coefficient signal of each order of the high-frequency power amplifier from the orthogonal modulation OFDM input signal, and an even symmetrical distortion compensation signal addition circuit to prepare an error even symmetrical distortion compensation signal (following envelope) from error of the orthogonal modulation OFDM input signal, the output of the high-frequency power amplifier and an even symmetrical distortion compensation coring signal obtained by coring the generated even symmetrical distortion compensation coefficient signal of each order and add an even symmetrical distortion compensation signal obtained by adding the error even symmetrical distortion compensation signal and the even symmetrical distortion compensation coefficient signal to the orthogonal modulation OFDM input signal, whereby odd symmetrical distortion and even symmetrical distortion are compensated independently.

Further, a transmitter uses the distortion compensation circuit and a high-frequency power amplifier of envelope tracking method power amplification system (EER) for varying a power supply voltage of the high-frequency power amplifier with an orthogonal modulation OFDM input signal.

Moreover, the transmitter includes a delay unit of a time constant for varying the power supply voltage of the high-frequency power amplifier with the orthogonal modulation OFDM input signal, the delay unit being inserted in a previous stage of the distortion compensation circuit.

Advantageous Effects of Invention

As described above, according to the present invention, the Cartesian loop transmission delay can be made shorter than the time constant of the memory effect and the even order distortion of the memory effect produced by the power amplifier can be compensated to converge the compensation in a short time.

DESCRIPTION OF EMBODIMENTS

The present invention is now described. First, distortion is described.

Figure 4A:
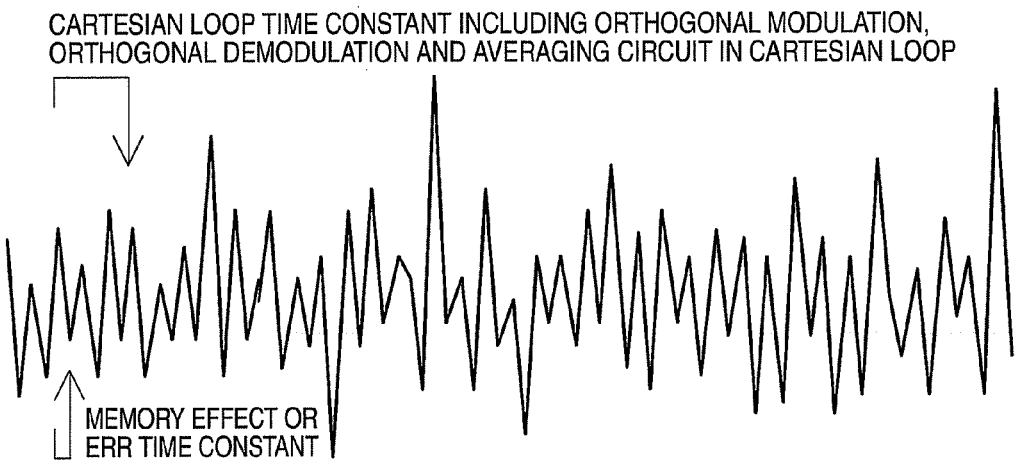
FIG. 4A is a schematic diagram illustrating (Cartesian) loop time constant (delay) of distortion compensation, ERR (power supply voltage variation) time constant (delay) and OFDM baseband input signal having orthogonal modulation, orthogonal demodulation and averaging circuits in Cartesian loop and time constant of memory effect distortion of a high-frequency power amplifier.
Figure 6:
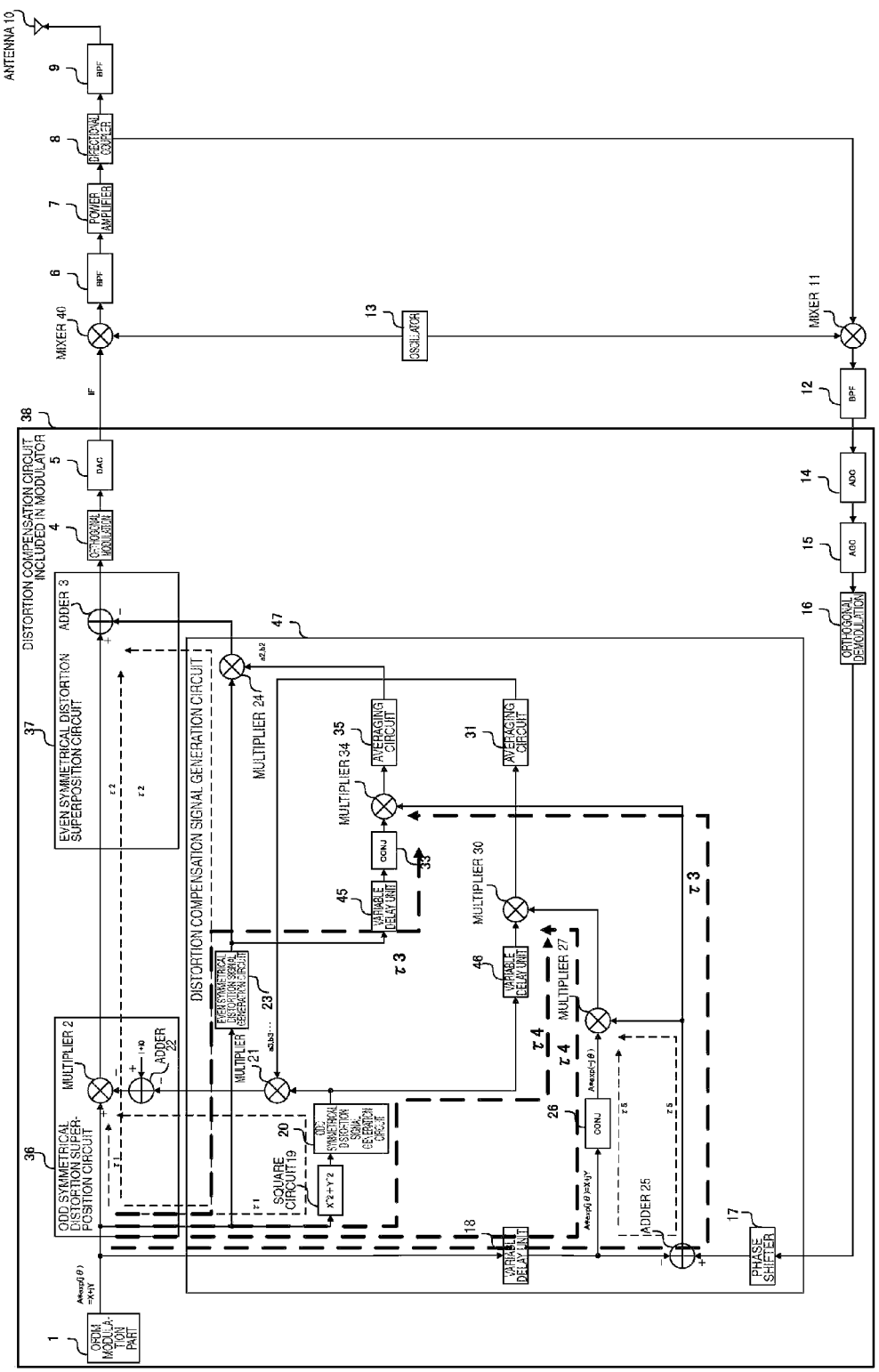
FIG. 6 is a block diagram schematically illustrating a transmitter including orthogonal modulation, orthogonal demodulation and averaging circuits in the Cartesian loop.

In the technique of subjecting even order distortion to amplitude differentiation and phase differentiation compensation in the patent literatures 2 and 3, as shown in FIG. 6 of a block diagram schematically illustrating a transmitter including orthogonal modulation, orthogonal demodulation and averaging circuits in a Cartesian loop, a long Cartesian loop (transmission) delay which is the total of a delay generated by passing through orthogonal modulation, D/A, frequency conversion and a filter of baseband and a delay generated by passing through frequency conversion, filter, A/D and orthogonal demodulation in a feedback path exists in the signal transmission in which an output signal of an amplifier is fed back to a baseband part in the Cartesian loop and signals before and behind amplification are compared to make detection and correction of error. Accordingly, as shown in FIG. 4A schematically illustrating a time constant of memory effect distortion of a high-frequency power amplifier, a time constant of the Cartesian loop of distortion compensation including orthogonal modulation, orthogonal demodulation and averaging circuits in the Cartesian loop and an OFDM baseband input signal, the delay in the Cartesian loop (transmission) is longer than the time constant (delay) of memory effect, the time constant (delay) of the (Cartesian) loop and the time constant (delay) of ERR (power supply voltage variation) even if even order distortion of the memory effect is changed due to characteristics of OFDM having small average power and large peak power. Furthermore, the delay in the Cartesian loop (transmission) is long and accordingly it takes time to make convergence of pre-compensation for reducing the even order distortion of the memory effect.

Moreover, the delay in the Cartesian loop (transmission) is longer than the time constant of the envelope detection tracking ERR of a high-frequency output signal for varying a power supply voltage of the high-frequency power amplifier with the orthogonal modulation OFDM input signal. Further, since the delay in the Cartesian loop (transmission) is long, convergence of pre-compensation requires time.

In addition, the delay in the Cartesian loop (transmission) is longer than the class AB peak variation time constant not shown and accordingly it takes time to make convergence of the pre-compensation.

Accordingly, the distortion reduction amount cannot be increased.

Hence, the delay in the Cartesian loop (transmission) is made shorter than the time constant of the memory effect. Further, the delay is made shorter than the time constant for varying the power supply voltage of the high-frequency power amplifier with the orthogonal modulation OFDM input signal. The delay is made shorter than the class AB peak variation time constant.

Figure 4B:
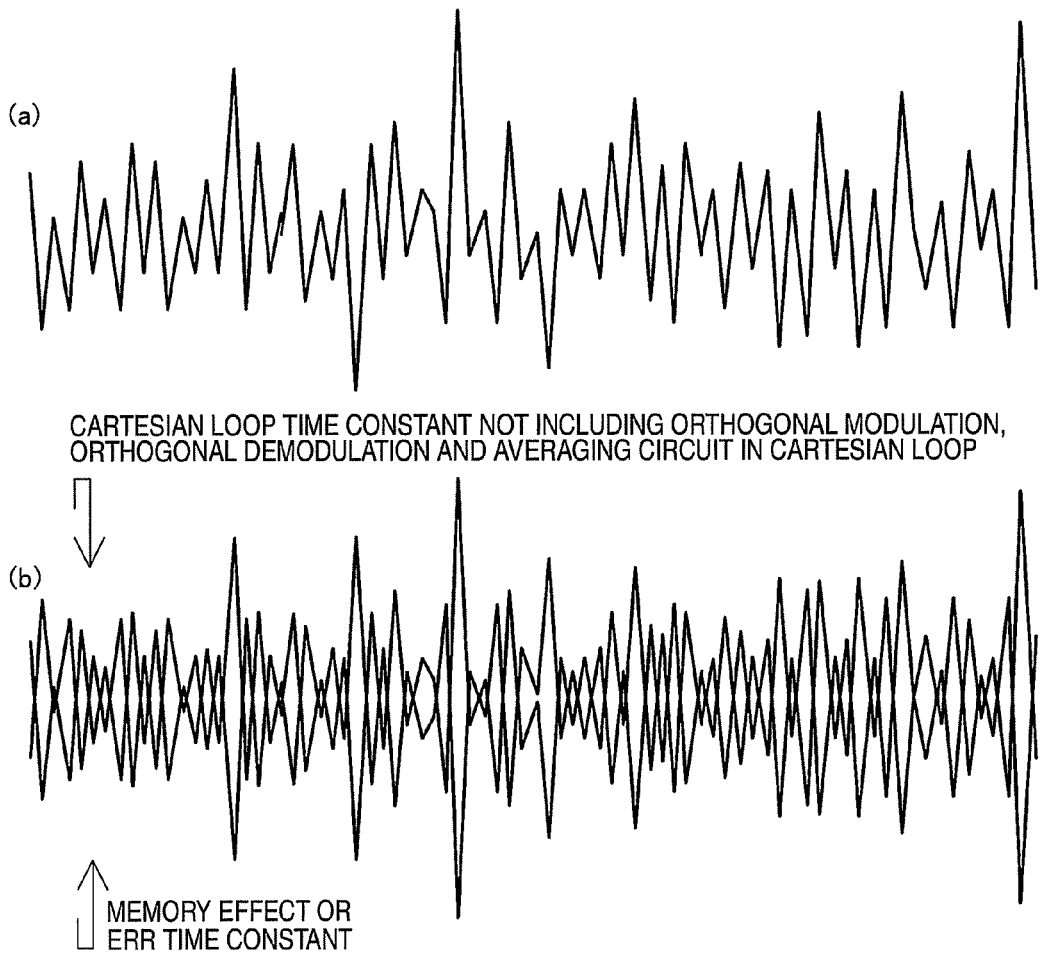
FIG. 4B is a schematic diagram illustrating loop time constant of distortion compensation and envelopes of OFDM high-frequency input signal and OFDM high-frequency output signal having no orthogonal modulation, orthogonal demodulation and averaging circuit in Cartesian loop and time constant (delay) of the memory effect distortion of the high-frequency power amplifier and envelope detection tracking (ERR) power supply voltage (approximating to baseband input signal) of a high-frequency output signal of the high-frequency power amplifier ((a) shows envelope detection tracking (ERR) power supply voltage (approximating to baseband input signal) of the high-frequency output signal of the high-frequency amplifier and (b) shows envelopes of OFDM high-frequency input signal and OFDM high-frequency output signal)

Furthermore, since the orthogonal modulation, the orthogonal demodulation and the averaging circuit are not provided in the Cartesian loop by providing digital frequency conversion, high-frequency band ADC and high-frequency band DAC or by providing orthogonal compensation ADC and orthogonal compensation DAC in compensation after orthogonal modulation as means for making compensation after orthogonal modulation of this method, symmetrical distortion and asymmetrical distortion can be detected independently and the delay in the Cartesian loop (transmission) for making compensation independently can be made short as shown in FIG. 4B schematically illustrating the envelope detection tracking (ERR) power supply voltage (approximating to the baseband input signal) of the high-frequency output signal of the high-frequency power amplifier, a time constant of memory effect distortion of the high-frequency power amplifier, a time constant of distortion compensation loop in which the orthogonal modulation, the orthogonal demodulation and the averaging circuit are not provided in the Cartesian loop and envelopes of the OFDM high-frequency input signal and the OFDM high-frequency output signal, so that convergence is made in a short time.

Accordingly, the distortion reduction amount can be increased.

Embodiment 1

Figure 1A:
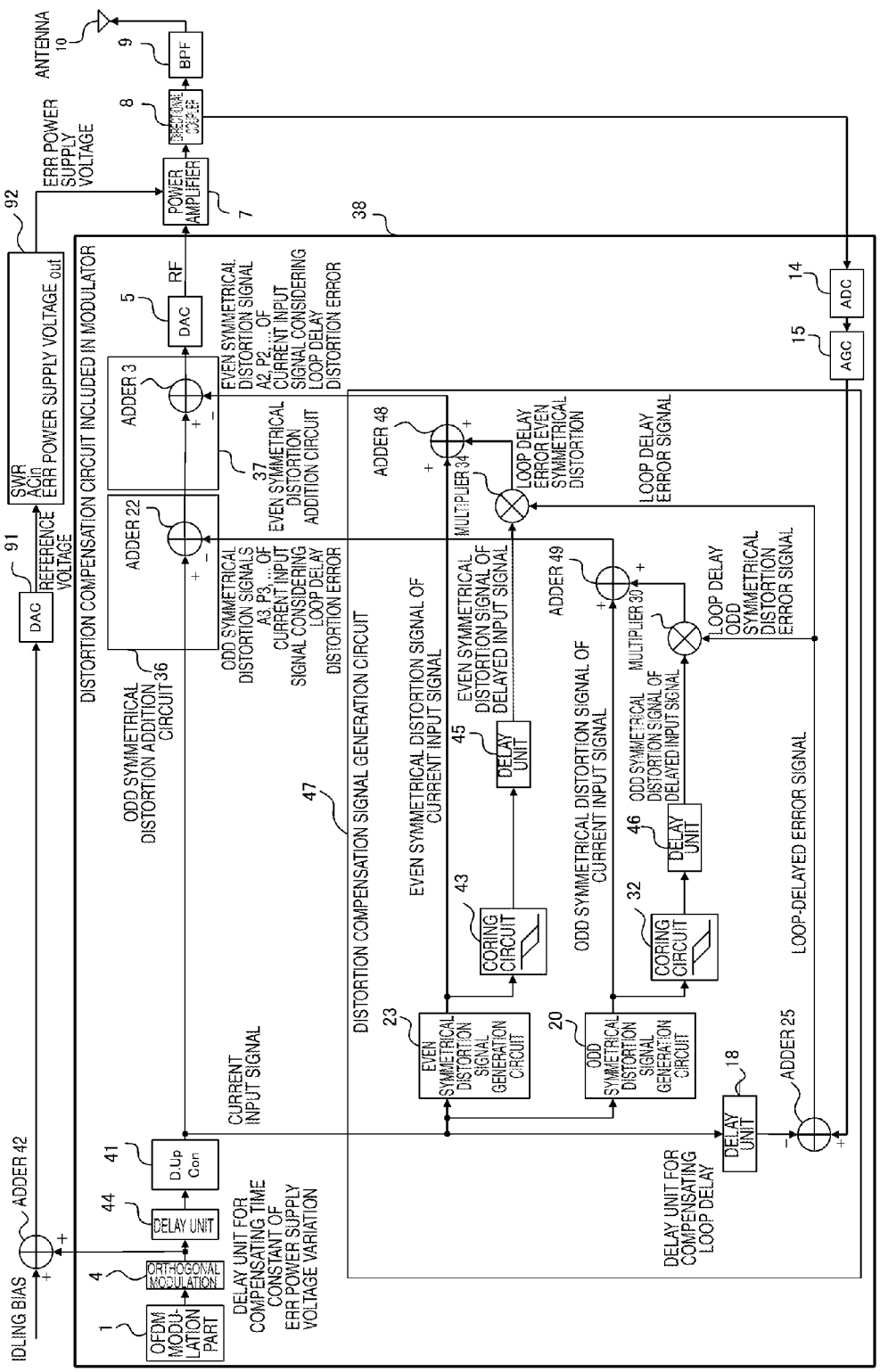
FIG. 1A is a block diagram schematically illustrating a transmitter according to an embodiment of the present invention (which includes digital frequency conversion, high-frequency band ADC and high-frequency DAC as means for making compensation after orthogonal modulation and does not include orthogonal modulation, orthogonal demodulation and an averaging circuit in a Cartesian loop)
Figure 2:
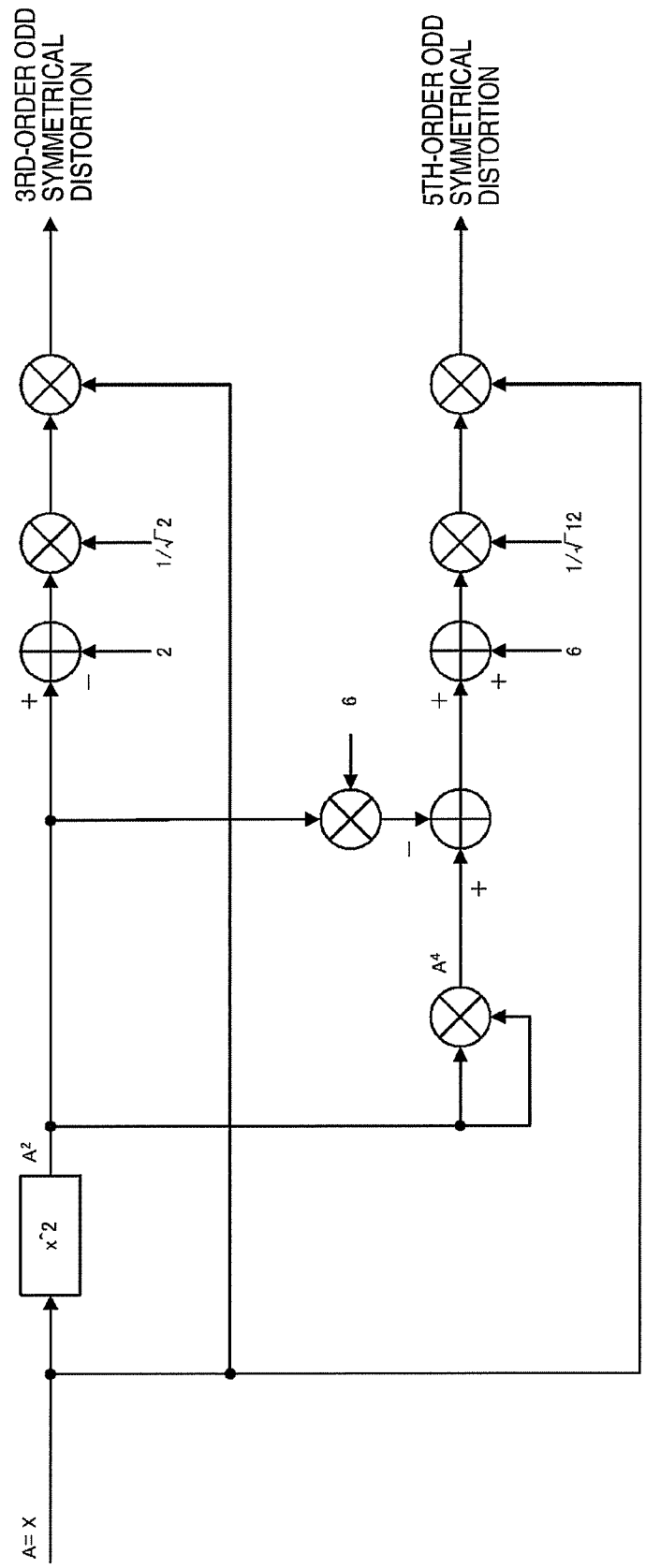
FIG. 2 is a block diagram schematically illustrating an odd symmetrical distortion signal generation circuit of the embodiment of the present invention (automatic calculation of coefficient)
Figure 3:
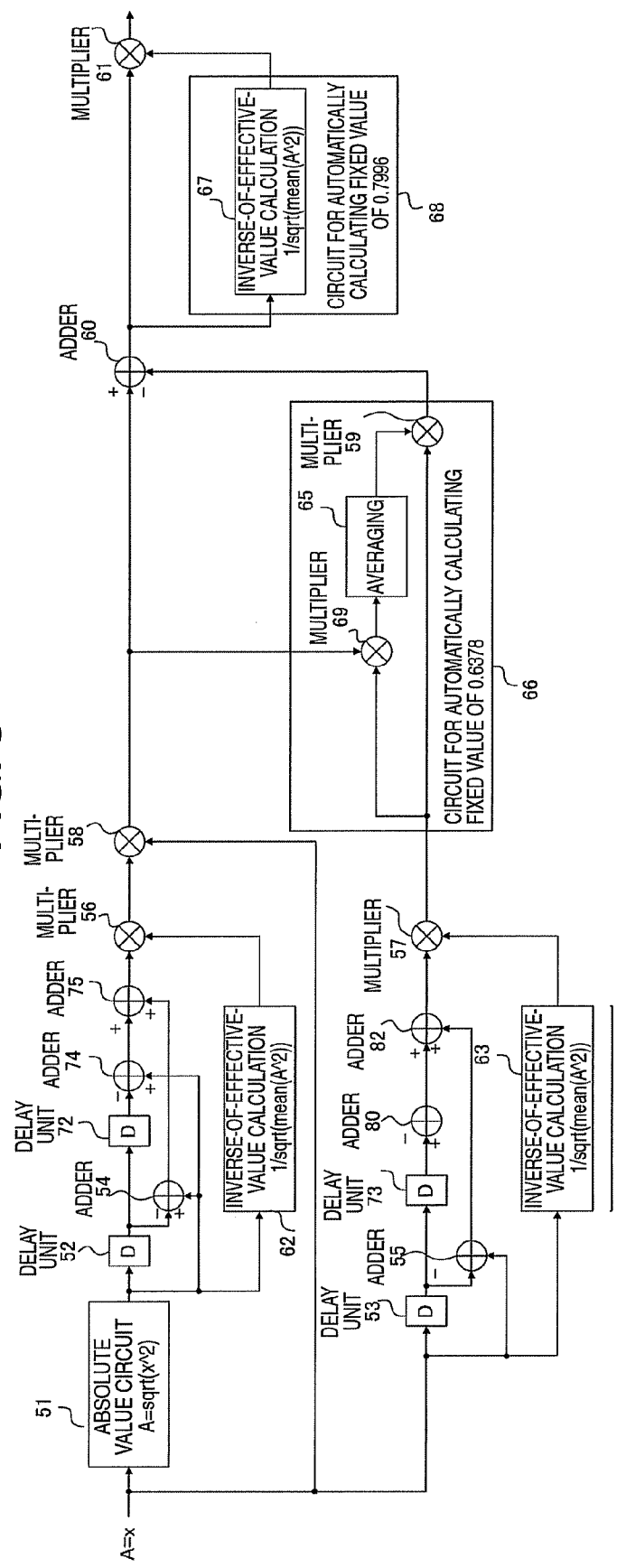
FIG. 3 is a block diagram schematically illustrating an even symmetrical distortion signal generation circuit of the embodiment of the present invention (automatic calculation of coefficient)
Figure 5A:
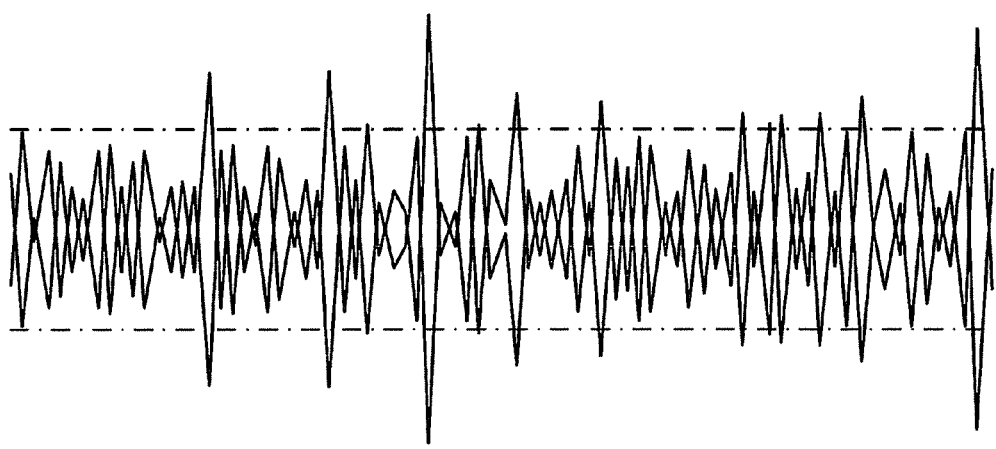
FIG. 5A is a schematic diagram illustrating envelopes of OFDM high-frequency input signal and coring threshold lines.
Figure 5B:
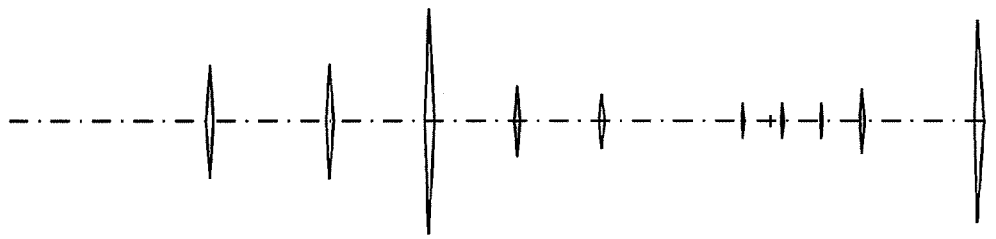
FIG. 5B is a schematic diagram illustrating envelope of the OFDM high-frequency input signal subjected to coring.

Configuration and operation of an embodiment of the present invention are now described referring to FIG. 1A schematically illustrating in a block diagram a transmitter of the embodiment of the present invention (digital frequency conversion of a digital up converter and a digital down converter, a high-frequency band ADC and a high-frequency band DAC for making compensation after orthogonal modulation), FIG. 2 illustrating in a block diagram an odd symmetrical distortion signal generation circuit in the embodiment of the present invention, FIG. 3 illustrating in a block diagram an even symmetrical distortion signal generation circuit in the embodiment of the present invention, FIG. 4A schematically illustrating a time constant of the memory effect distortion of a high-frequency power amplifier, a time constant of a Cartesian loop of distortion compensation in comparison of baseband input signals and an OFDM baseband input signal, FIG. 4B schematically illustrating envelope detection tracking (ERR) power supply voltage (approximating to the baseband input signal) of the high-frequency output signal of the high-frequency power amplifier, the time constant of memory effect distortion of the high-frequency power amplifier, the time constant of distortion compensation loop in comparison of input signals at high frequency and envelopes of an OFDM high-frequency input signal and an OFDM high-frequency output signal, FIG. 5A schematically illustrating envelopes of the OFDM high-frequency input signal and coring threshold lines and FIG. 5B schematically illustrating envelope of the OFDM high-frequency input signal subjected to coring.

In the embodiment 1, difference (approximating to differentiation) between an input signal before sampling and the sampled input signal is calculated and coefficient and the input signal are subjected to complex multiplication to approximate a differentiation component of amplitude of the memory effect. Difference (approximating to differentiation) between the input signal before sampling and the sampled input signal is calculated and a differentiation component of even order distortion of the memory effect is approximated. The results thereof are linearly combined to thereby approximate inverse characteristics of the even order distortion of the memory effect.

A digital input signal outputted from an OFDM modulator 1 provided in a distortion compensation circuit 38 included in a modulator of the present invention is modulated by an orthogonal modulator (orthogonal modulation) 4 and is supplied to an adder 22 and a delay unit 18 through a delay unit 44 and a digital up converter 41. The input signal delayed by the delay unit 18 is inputted to a multiplier 30 and a multiplier 34 for detecting a distortion coefficient. An output signal of the adder 22 is supplied to an adder 3 and an output signal of the adder 3 is converted into an analog signal by a DAC 5. Thereafter, the analog signal is outputted from the distortion compensation circuit 38 and is power-amplified to a prescribed level by a high-frequency power amplifier (power amplifier) 7. An output signal produced by the power amplifier 7 passes through a directional coupler 8 and a BPF 9 to be transmitted as radio waves by an antenna 10.

On the other hand, the signal distributed by or branching off from the directional coupler 8 is converted into a digital signal by an A/D converter (ADC) 14. The converted signal is adjusted to be a signal having a proper level by an auto gain controller (AGC) 15 and is supplied to the multiplier 30 and the multiplier 34 for detecting the distortion coefficient.

Coefficients (magnitudes) of 3rd-order odd symmetrical distortion (A3, P3) to 7th-order odd symmetrical distortion (A7, P7) and 2nd-order even symmetrical distortion (A2, P2) are detected independently from the input signal by an odd symmetrical distortion signal generation circuit 20 and an even symmetrical distortion signal generation circuit 23, respectively. The detected odd symmetrical distortion coefficient and even symmetrical distortion coefficient are subjected to being cored by coring circuits 32 and 43 for only peak as shown in FIG. 5B, being adjusted to have the same delay as the signal of distortion (difference between input and feedback signals) in output of the adder 25 by means of delay units 45 and 46, being multiplied by signals of distortion (difference between input and feedback signals) in output of the adder 25 by means of multipliers 30 and 34 and being added to odd symmetrical distortion coefficient and even symmetrical distortion coefficient in adders 48 and 49, respectively, so that the detected odd symmetrical distortion coefficient and even symmetrical distortion coefficient become odd symmetrical distortion compensation signal and even symmetrical distortion compensation signal, respectively. The odd symmetrical distortion compensation signal and even symmetrical distortion compensation signal are added to the input signal in an odd symmetrical distortion addition circuit 36 and an even symmetrical distortion addition circuit 37, respectively.

Since detection of the odd symmetrical distortion coefficient and addition of the odd symmetrical distortion are the same as the patent literature 1, the detailed description thereof is omitted and simple description thereof is made. Different points of the present invention are described centering on detection of the even symmetrical distortion coefficient and addition of the even symmetrical distortion.

Detection of coefficients of 2nd-order even symmetrical amplitude distortion (A2) and 2nd-order even symmetrical phase distortion (P2) in the even symmetrical distortion signal generation circuit 23 in FIG. 1A illustrating in a block diagram the transmitter of the embodiment of the present invention is described referring to FIG. 3 illustrating in a block diagram (amplitude differentiation and phase differentiation) an even symmetrical distortion generation circuit of the embodiment of the present invention.

The input signal is converted into a real signal of an absolute value of a complex signal by an absolute value circuit 51. The converted real signal is supplied to a delay unit (D) 52 and an adder 54, in which difference (approximating to differentiation) between the converted real signal and a real signal before one sample is calculated. The converted real signal is supplied to an inverse-of-effective-value calculation circuit 62, which calculates an inverse of an effective value, which is multiplied by a difference output signal of the adder 54 in a multiplier 56. Moreover, an output signal of the multiplier 56 is multiplied by the input signal in a multiplier 58 to calculate 2nd-order even symmetrical amplitude differentiation distortion coefficient.

Furthermore, the input signal is supplied to a delay unit (D) 53 and an adder 55, in which difference (approximating to differentiation) between the input signal and the input signal before one sample thereof is calculated. Furthermore, the input signal is supplied to an inverse-of-effective-value calculation circuit 63, which calculates an inverse of an effective value, which is multiplied by a difference output signal of the adder 55 in a multiplier 57. An output signal of the multiplier 57 is multiplied by a coefficient of 0.6378 in a multiplier 59 to calculate 2nd-order even symmetrical amplitude differentiation phase distortion coefficient.

An output signal of the multiplier 58 and an output signal of the multiplier 59 are added in an adder 60, which outputs coefficients of 2nd-order even symmetrical amplitude distortion (A2) and 2nd-order even symmetrical phase distortion (P2) of memory effect.

Referring to FIG. 1A illustrating in a block diagram the transmitter of the embodiment of the present invention, distortion addition is described. In FIG. 1A, the even symmetrical distortion signal of the current input signal outputted by the even symmetrical distortion signal generation, circuit 23 is cored by the coring circuit 43 to be supplied to the delay unit 45, which outputs an even symmetrical distortion signal of a delayed input signal which is delayed by a (Cartesian) loop (transmission) delay. Furthermore, the even symmetrical distortion signal outputted by the delay unit 45 is multiplied by a (Cartesian) loop (transmission) delay error signal produced by the adder 25 in a multiplier 34, which produces a (Cartesian) loop (transmission) delay even symmetrical distortion error signal. Moreover, the even symmetrical distortion signal of the current input signal is added to the (Cartesian) loop (transmission) delay even symmetrical distortion error signal in adder 48, which produces an even symmetrical distortion signal of the current input signal considering the (Cartesian) loop (transmission) delay distortion error to be added to the current input signal in the adder 3.

Further, in FIG. 1A, the odd symmetrical distortion signal of the current input signal outputted by the odd symmetrical distortion signal generation circuit 20 is cored by the coring circuit 32 and is supplied to the delay unit 46, which produces an odd symmetrical distortion signal of the delayed input signal which is delayed by a (Cartesian) loop (transmission) delay. Further, the odd symmetrical distortion signal produced by the delay unit 46 is multiplied by a (Cartesian) loop (transmission) delay error signal produced by the adder 25 in a multiplier 30, which produces a (Cartesian) loop (transmission) delay odd symmetrical distortion error signal. Moreover, the odd symmetrical distortion signal of the current input signal is added to the (Cartesian) loop (transmission) delay odd symmetrical distortion error signal in adder 49, which produces an odd symmetrical distortion signal of the current input signal considering the (Cartesian) loop (transmission) delay distortion error to be added to the current input signal in the adder 22.

In the embodiment of the present invention, orthogonal modulation, orthogonal demodulation, up/down frequency conversion, BPF, a phase device and an averaging circuit are not provided in the Cartesian loop and variation in envelope of the power supply voltage is followed at low delay. Further, since delay is short and stable, the delay units 18, 45 and 46 for compensating the (Cartesian) loop (transmission) delay and the delay unit 44 for compensating the time constant (delay) in variation of ERR power supply voltage can be fixed.

Moreover, stabilization is attained in the class A steady state by means of the coring of the input signal instead of an averaging circuit and class AB peak is followed at low delay.

Consequently, the orthogonal modulation, the orthogonal demodulation and the averaging circuit are not provided in the Cartesian loop by providing digital frequency conversion, high-frequency band ADC and high-frequency band DAC as means for making compensation after orthogonal modulation and accordingly as shown in FIG. 4B illustrating in a schematic diagram envelope detection tracking (ERR) power supply voltage (approximating to the baseband input signal) of the high-frequency output signal of the high-frequency power amplifier, the time constant of memory effect distortion of the high-frequency power amplifier, the time constant of distortion compensation loop in which the orthogonal modulation, the orthogonal demodulation and the averaging circuit are not provided in the Cartesian loop and envelopes of the OFDM high-frequency input signal and the OFDM high-frequency output signal, symmetrical distortion and asymmetrical distortion can be detected independently and the delay in the Cartesian loop transmission for making compensation independently can be made short to the same degree as the time constant of the memory effect, the envelope detection tracking ERR time constant (delay) of the high-frequency output signal or class AB peak variation time constant (delay) not shown, so that even if the distortion improvement amount is increased, convergence is made in a short time.

Embodiment 2

Next, an embodiment 2 is described. Description of the same configuration and operation as the embodiment 1 is omitted and only different points are described.

Figure 1B:
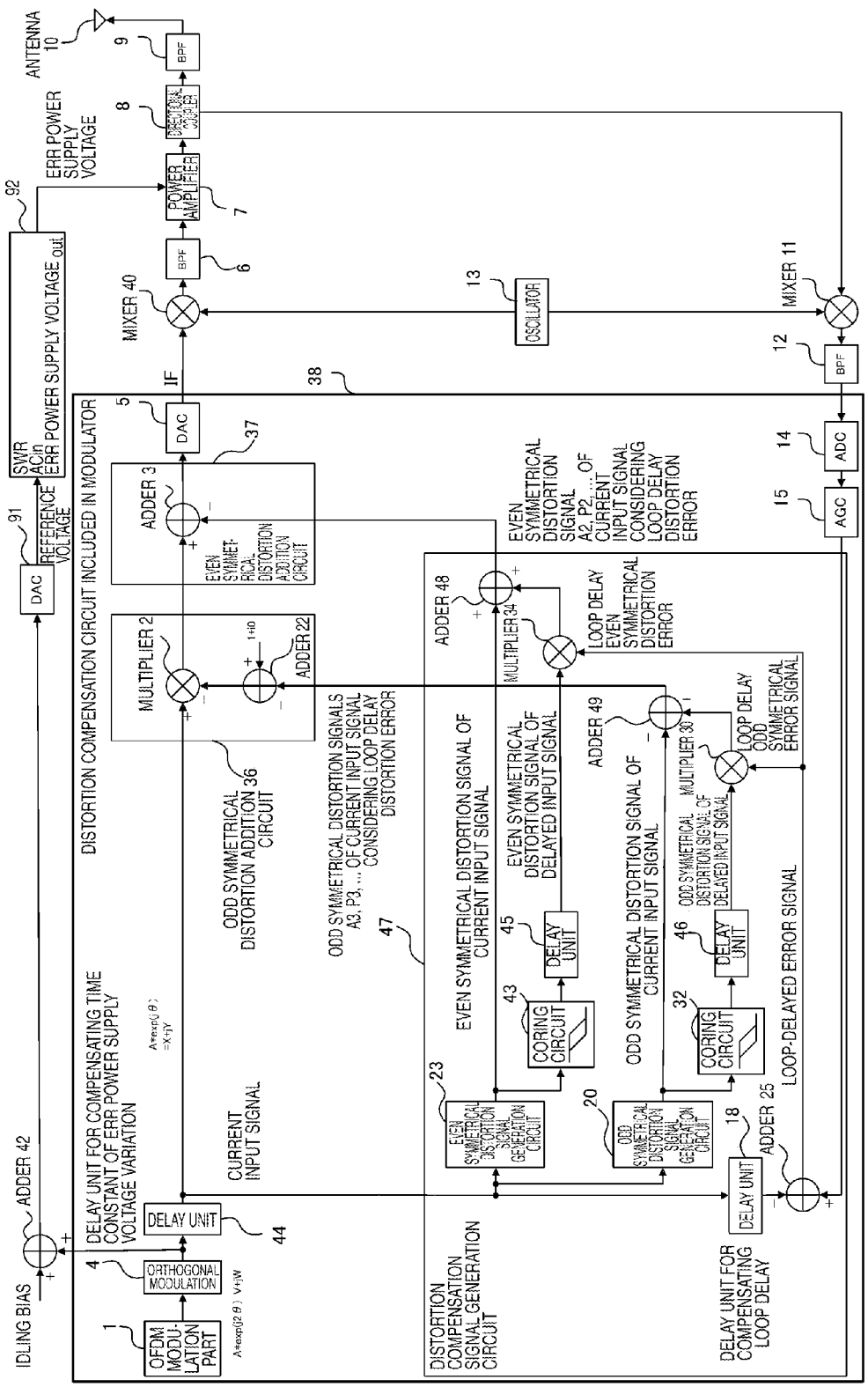
FIG. 1B is a block diagram schematically illustrating a transmitter according to an embodiment of the present invention (which includes orthogonal compensation ADC and orthogonal compensation DAC as means for making compensation after orthogonal modulation and does not include orthogonal modulation, orthogonal demodulation and an averaging circuit in the Cartesian loop)

Description of configuration and operation of the embodiment of the present invention is made referring to FIG. 1B illustrating in a block diagram the transmitter (orthogonal compensation ADC and orthogonal compensation DAC after orthogonal modulation) of the embodiment of the present invention instead of FIG. 1A illustrating in a block diagram the transmitter (digital frequency conversion, high-frequency band ADC and high-frequency band DAC of a digital up converter and a digital down converter in compensation after orthogonal modulation) of the embodiment of the present invention.

In FIG. 1B, a digital input signal produced by an OFDM modulator 1 provided in a distortion compensation circuit 38 included in a modulator of the present invention is modulated by an orthogonal modulator (orthogonal modulation) 4 and is supplied to a multiplier 2 and a delay unit 18 through a delay unit 44. The input signal delayed by the delay unit 18 is supplied to the multiplier 30 and the multiplier 34 for detecting a distortion coefficient. An output signal of the multiplier 2 is inputted to an adder 3 and an output signal of the adder 3 is converted into an analog signal by a DAC 5. Then, the analog signal is outputted from a distortion compensation circuit 38 and a frequency of the analog signal is converted by a mixer 40 and an oscillator 13. The analog signal having the converted frequency is supplied to a BPF 6 to remove unnecessary waves or signals therefrom and is amplified to a prescribed power level by a high-frequency power amplifier (power amplifier) 7. An output signal produced by the power amplifier 7 passes through a directional coupler 8 and a BPF 9 and is transmitted as radio waves by an antenna 10.

On the other hand, a signal distributed by or branching off from the directional coupler 8 is subjected to frequency conversion by means of a mixer 11 and the oscillator 13 and is supplied to a BPF 12 to remove unnecessary waves or signals therefrom. Then, the signal produced by the BPF 12 is inputted to the distortion compensation circuit 38 included in the modulator. The signal inputted to the distortion compensation circuit is converted into a digital signal by an orthogonal compensation A/D converter (ADC) 14. The converted signal is adjusted to be a signal having a proper level by an auto gain controller (AGC) 15 and is supplied to an adder 25.

In the embodiment of the present invention, orthogonal modulation, orthogonal demodulation, a phase device and an averaging circuit are not provided in the Cartesian loop and variation in envelope of the power supply voltage is followed at low delay. Further, since delay is short and stable, the delay units 18, 45 and 46 for compensating the (Cartesian) loop (transmission) delay and the delay unit 44 for compensating the time constant (delay) in variation of ERR power supply voltage can be fixed.

Moreover, stabilization is attained in the class A steady state by means of the coring of the input signal instead of an averaging circuit and class AB peak is followed at low delay.

Consequently, the orthogonal modulation, the orthogonal demodulation and the averaging circuit are not provided in the Cartesian loop by providing the orthogonal compensation ADC and the orthogonal compensation DAC as means for making compensation after orthogonal modulation and accordingly as shown in FIG. 4B illustrating in a schematic diagram an envelope detection tracking (ERR) power supply voltage (approximating to the baseband input signal) of the high-frequency output signal of the high-frequency power amplifier, the time constant of memory effect distortion of the high-frequency power amplifier, the time constant of distortion compensation loop in which the orthogonal modulation, the orthogonal demodulation and the averaging circuit are not provided in the Cartesian loop and envelopes of the OFDM high-frequency input signal and the OFDM high-frequency output signal, symmetrical distortion and asymmetrical distortion can be detected independently and the delay in the Cartesian loop transmission for making compensation independently can be made short to the same degree as the time constant of the memory effect, the envelope detection tracking ERR time constant of the high-frequency output signal or class AB peak variation time constant not shown, so that even if the distortion improvement amount is increased, convergence is made in a short time.

According to the present invention, without being limited to the embodiments 1 and 2, in the distortion pre-compensation circuit which independently forms coefficients of the odd symmetrical distortion compensation signal of each order of the high-frequency power amplifier which amplifies the input signal at high-frequency band, the present invention can be widely applied to the distortion pre-compensation circuit which independently forms plural coefficients of the compensation signal of even order distortion of the memory effect of the input signal.

INDUSTRIAL APPLICABILITY

Specifically, the present invention can be widely applied to the transmitter of large power in digital modulation in which the ratio band for a ratio between a center frequency and a signal band is high without being extremely different from 1 and a difference between peak power and average power is large as in a transmitter for 400 W-multimedia broadcasting having the frequencies of 90 MHz to 108 MHz and 208 MHz to 222 MHz or the like.

REFERENCE SINGS LIST

1: OFDM modulator (digital output of OFDM-MOD),
92: SWR AC in ERR POWER SUPPLY VOLTAGEout,
4: orthogonal modulator (orthogonal modulation),
5, 91: D/A converter (DAC),
16: orthogonal demodulator (orthogonal demodulation),
11, 40: mixer,
6, 9, 12: BPF,
13: oscillator,
14: A/D converter (ADC),
15: auto gain controller (AGC),
7: high-frequency power amplifier (power amplifier),
8: directional coupler,
10: antenna,
2, 21, 24, 27 30, 34, 56, 57, 58, 59 61, 69: multiplier,
3, 22, 25, 42 48 49 54, 55, 60, 74, 75, 80, 82: adder,
20: odd symmetrical distortion signal generation circuit,
23: even symmetrical distortion signal generation circuit,
31, 35, 65: averaging circuit;
36: odd symmetrical distortion addition circuit,
37: even symmetrical distortion addition circuit,
41: digital up converter,
38: distortion compensation circuit included in modulator,
47: distortion compensation signal generation circuit,
32, 43: coring circuit,
19: square circuit,
51: absolute value circuit,
62, 63, 67: inverse-of-effective-value calculation circuit,
17: phase shifter,
18, 44, 45, 46, 52, 53, 72, 73: delay unit,
66: circuit for automatically calculating fixed value of 0.6378,
68: circuit for automatically calculating fixed value of 0.7996.

The invention claimed is:

1. A distortion compensation circuit which compensates distortion of a high-frequency power amplifier which power-amplifies an OFDM input signal having a frequency converted in a high-frequency band or an OFDM input signal in a high-frequency band, comprising:
an odd symmetrical distortion compensation signal generation circuit to independently generate an odd symmetrical distortion compensation coefficient signal of each order of the high-frequency power amplifier from a high-frequency signal or a high-frequency IF signal or a high-frequency OFDM input signal which is an input signal in a high-frequency band (hereinafter referred to as a high-frequency OFDM input signal) obtained by subjecting an OFDM signal to orthogonal modulation and digital-up conversion;

an odd symmetrical distortion compensation signal addition circuit to prepare an error odd symmetrical distortion compensation signal from error of the high-frequency OFDM input signal, an output of the high-frequency power amplifier and an odd symmetrical distortion compensation coring signal obtained by coring the generated odd symmetrical distortion compensation coefficient signal of each order and add an odd symmetrical distortion compensation signal obtained by adding the error odd symmetrical distortion compensation signal and the odd symmetrical distortion compensation coefficient signal to the high-frequency OFDM input signal;

an even symmetrical distortion compensation signal generation circuit to independently generate an even symmetrical distortion compensation coefficient signal of each order of the high-frequency power amplifier from the high-frequency OFDM input signal; and an even symmetrical distortion compensation signal addition circuit to prepare an error even symmetrical distortion compensation signal from error of the high-frequency OFDM input signal, the output of the high-frequency power amplifier and an even symmetrical distortion compensation coring signal obtained by coring the generated even symmetrical distortion compensation coefficient signal of each order and add an even symmetrical distortion compensation signal obtained by adding the error even symmetrical distortion compensation signal and the even symmetrical distortion compensation coefficient signal to the high-frequency OFDM input signal, wherein odd symmetrical distortion and even symmetrical distortion are configured to be compensated independently.

2. A transmitter using a pre-compensation distortion circuit and a high-frequency power amplifier of envelope tracking method power amplification system (EER) according to claim 1, comprising a delay unit of a time constant for varying a power supply voltage of the high-frequency power amplifier with an orthogonal modulation OFDM input signal, the delay unit being inserted in a previous stage of the distortion compensation circuit.

3. A distortion compensation circuit which compensates distortion of a high-frequency power amplifier which power amplifies an OFDM input signal having a frequency converted in a high-frequency band, comprising:

an odd symmetrical distortion compensation signal generation circuit to independently generate an odd symmetrical distortion compensation coefficient signal of each order of the high-frequency power amplifier from an OFDM input signal (hereinafter referred to as an orthogonal modulation OFDM input signal) obtained by subjecting an OFDM signal to orthogonal modulation;

an odd symmetrical distortion compensation signal addition circuit to prepare an error odd symmetrical distortion compensation signal from error of the orthogonal modulation OFDM input signal, an output of the high-frequency power amplifier and an odd symmetrical distortion compensation coring signal obtained by coring the generated odd symmetrical distortion compensation coefficient signal of each order and add an odd symmetrical distortion compensation signal obtained by adding the error odd symmetrical distortion compensation signal and the odd symmetrical distortion compensation coefficient signal to the orthogonal modulation OFDM input signal;

an even symmetrical distortion compensation signal generation circuit to independently generate an even symmetrical distortion compensation coefficient signal of each order of the high-frequency power amplifier from the orthogonal modulation OFDM input signal; and an even symmetrical distortion compensation signal addition circuit to prepare an error even symmetrical distortion compensation signal from error of the orthogonal modulation OFDM input signal, the output of the high-frequency power amplifier and an even symmetrical distortion compensation coring signal obtained by coring the generated even symmetrical distortion compensation coefficient signal of each order and add an even symmetrical distortion compensation signal obtained by adding the error even symmetrical distortion compensation signal and the even symmetrical distortion compensation coefficient signal to the orthogonal modulation OFDM input signal, wherein odd symmetrical distortion and even symmetrical distortion are configured to be compensated independently.

4. A transmitter using a pre-compensation distortion circuit and a high-frequency power amplifier of envelope tracking method power amplification system (EER) according to claim 3, comprising a delay unit of a time constant for varying a power supply voltage of the high-frequency power amplifier with an orthogonal modulation OFDM input signal, the delay unit being inserted in a previous stage of the distortion compensation circuit.

* * * * *